United States Patent … US 10,522,794 B2
Khayrullin et al. … Dec. 31, 2019

(54) METHOD OF ACTIVE ALIGNMENT FOR DIRECT PATTERNING HIGH RESOLUTION MICRO-DISPLAY

(71) Applicant: eMagin Corporation, Hopewell Junction, NY (US)

(72) Inventors: Ilyas I. Khayrullin, Hopewell Junction, NY (US); Evan P. Donoghue, Hopewell Junction, NY (US); Kerry Tice, Hopewell Junction, NY (US); Tariq Ali, Hopewell Junction, NY (US); Qi Wang, Hopewell Junction, NY (US); Fridrich Vazan, Pittsford, NY (US); Amalkumar P. Ghosh, Hopewell Junction, NY (US)

(73) Assignee: eMagin Corporation, Hopewell Junction, NY (US)

(*) Notice: Subject to any disclaimer, the term of this patent is extended or adjusted under 35 U.S.C. 154(b) by 0 days.

(21) Appl. No.: 16/178,441

(22) Filed: Nov. 1, 2018

(65) Prior Publication Data
US 2019/0131590 A1    May 2, 2019

Related U.S. Application Data

(60) Provisional application No. 62/580,158, filed on Nov. 1, 2017.

(51) Int. Cl.
*H01L 21/00* (2006.01)
*H01L 51/56* (2006.01)
(Continued)

(52) U.S. Cl.
CPC ............ *H01L 51/56* (2013.01); *C23C 14/042* (2013.01); *C23C 14/24* (2013.01); *H01L 22/20* (2013.01);
(Continued)

(58) Field of Classification Search
CPC ... H01L 22/20; H01L 23/544; H01L 51/0011; H01L 51/56; G03F 7/706; G03F 7/70625;
(Continued)

(56) References Cited

U.S. PATENT DOCUMENTS

2013/0050668 A1* 2/2013 Kisteman ............ G03F 7/70641
355/55
2013/0100427 A1* 4/2013 Koolen ..................... G03F 1/42
355/67

\* cited by examiner

*Primary Examiner* — Brook Kebede
(74) *Attorney, Agent, or Firm* — Kaplan Breyer Schwarz, LLP

(57) ABSTRACT

A method of active alignment of a shadow mask to a substrate includes a first alignment by moving the shadow mask and the substrate a first distance in a vertical direction, capturing a first alignment image, determining at least one of a first correction distance and a first rotational correction angle, and aligning the shadow mask and the substrate by moving the first correction distance and rotating the first rotational correction angle. The method further includes performing a first material deposition process on the substrate and continuously capturing a first series of alignment images during the generation of the first material deposition flow. During the generation of the first material deposition flow the first series of alignment images are analyzed to determine a second correction distance and a second rotational correction angle and determining whether second distance and/or rotational correction angle is greater than or equal to a predetermined value to cause a second alignment process to occur.

22 Claims, 6 Drawing Sheets

(51) Int. Cl.
*H01L 51/00* (2006.01)
*H01L 23/544* (2006.01)
*C23C 14/24* (2006.01)
*C23C 14/04* (2006.01)
*H01L 21/66* (2006.01)

(52) U.S. Cl.
CPC ........ *H01L 23/544* (2013.01); *H01L 51/0011* (2013.01); *H01L 2223/54426* (2013.01)

(58) Field of Classification Search
CPC . G03F 7/70633; G03F 7/7015; C23C 14/042; C23C 14/24; G01B 11/272; G01N 21/47
USPC .......................................................... 438/14
See application file for complete search history.

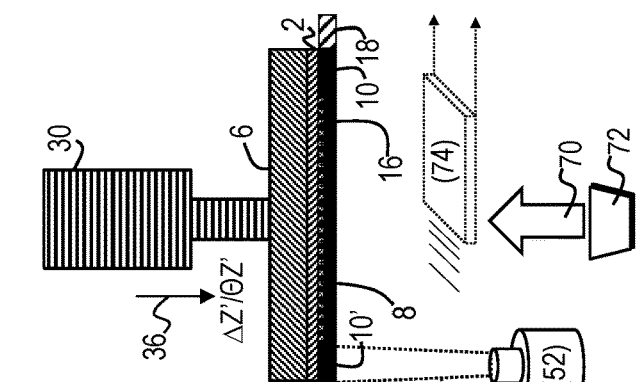
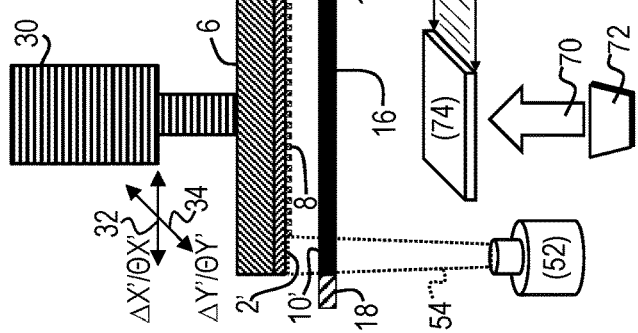
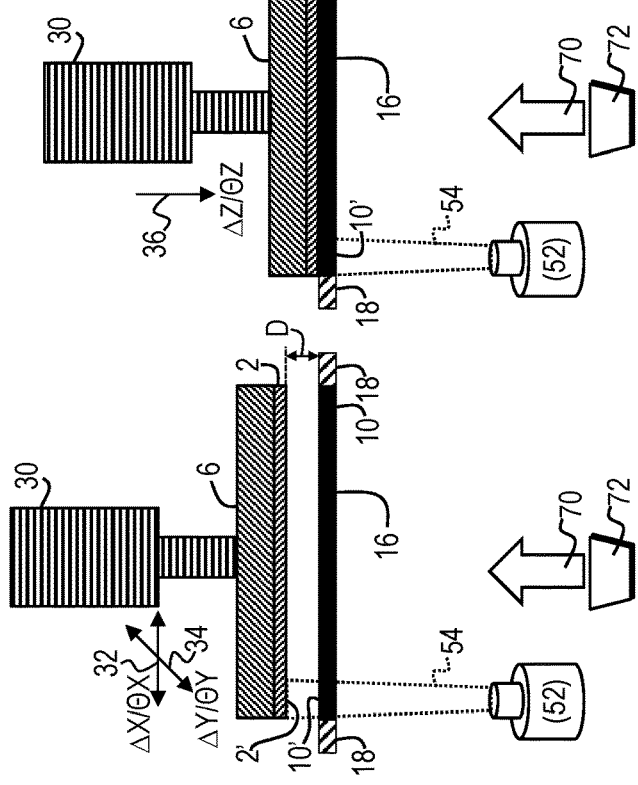

FIG. 4A

400 — PROVIDING AN ALIGNMENT SYSTEM INCLUDING:
A MOTION CONTROL SYSTEM CONFIGURED TO MOVE AT LEAST ONE OF THE SHADOW MASK AND THE SUBSTRATE WITH RESPECT TO EACH OTHER;
AN IMAGE CAPTURING SYSTEM CONFIGURED TO CAPTURE AN ALIGNMENT IMAGE REPRESENTING AN ALIGNMENT CONDITION OF THE SHADOW MASK WITH RESPECT TO THE SUBSTRATE; AND
A PROCESSOR CONFIGURED TO PERFORM ALIGNMENT DETERMINATION AND MOTION CONTROL IN COMMUNICATION WITH THE MOTION CONTROL SYSTEM AND THE IMAGE CAPTURING SYSTEM

402 — PERFORMING A FIRST ALIGNMENT PROCESS OF THE SHADOW MASK AND THE SUBSTRATE BY:
MOVING, BY THE MOTION CONTROL SYSTEM, AT LEAST ONE OF THE SHADOW MASK AND THE SUBSTRATE A FIRST DISTANCE IN A VERTICAL DIRECTION WITH RESPECT TO EACH OTHER;
CAPTURING, BY THE IMAGE CAPTURING SYSTEM, A FIRST ALIGNMENT IMAGE;
DETERMINING, BY THE ALIGNMENT SYSTEM AND IN RESPONSE TO ANALYZING THE FIRST ALIGNMENT IMAGE, AT LEAST ONE OF A FIRST CORRECTION DISTANCE IN A CONTROL DIRECTION OF THE MOTION CONTROL SYSTEM AND A FIRST ROTATIONAL CORRECTION ANGLE ABOUT A CONTROL AXIS OF THE MOTION CONTROL SYSTEM; AND
ALIGNING, BY THE MOTION CONTROL SYSTEM, THE SHADOW MASK AND THE SUBSTRATE BY MOVING AT LEAST ONE OF THE FIRST CORRECTION DISTANCE IN THE CONTROL DIRECTION AND ROTATING THE FIRST ROTATIONAL CORRECTION ANGLE ABOUT THE CONTROL AXIS

404 — MOVING, BY THE MOTION CONTROL SYSTEM, THE SHADOW MASK AND THE SUBSTRATE IN THE VERTICAL DIRECTION INTO A FIRST CONTACT POSITION WITH EACH OTHER BASED ON PERFORMING THE FIRST ALIGNMENT PROCESS OF THE SHADOW MASK AND SUBSTRATE

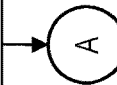

FIG. 4C

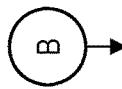

408 — PERFORMING, BY THE ALIGNMENT SYSTEM BASED ON DETERMINING THE AT LEAST ONE OF THE SECOND CORRECTION DISTANCE AND THE SECOND ROTATIONAL CORRECTION ANGLE BEING GREATER THAN OR EQUAL TO THE PREDETERMINED VALUE, A SECOND ALIGNMENT PROCESS OF THE SHADOW MASK AND SUBSTRATE BY:

BLOCKING THE MATERIAL DEPOSITION FLOW THROUGH THE SHADOW MASK PATTERNING THROUGH-HOLES; SEPARATING, BY THE MOTION CONTROL SYSTEM, THE SHADOW MASK FROM THE SUBSTRATE BY A SECOND DISTANCE IN THE VERTICAL DIRECTION;

ALIGNING, BY THE MOTION CONTROL SYSTEM, THE SHADOW MASK AND THE SUBSTRATE BY AT LEAST ONE OF THE SECOND CORRECTION DISTANCE IN THE CONTROL DIRECTION OF THE MOTION CONTROL SYSTEM AND THE SECOND ROTATIONAL CORRECTION ANGLE ABOUT THE CONTROL AXIS OF THE MOTION CONTROL SYSTEM; AND

MOVING, BY THE MOTION CONTROL SYSTEM, THE SHADOW MASK AND THE SUBSTRATE IN THE VERTICAL DIRECTION INTO A SECOND CONTACT POSITION WITH EACH OTHER

410 — PERFORMING A SECOND MATERIAL DEPOSITION PROCESS ON THE SUBSTRATE COMPRISING:
UNBLOCKING THE MATERIAL DEPOSITION FLOW THROUGH THE SHADOW MASK PATTERNING THROUGH-HOLES CONFIGURED TO ENABLE THE MATERIAL DEPOSITION FLOW TO BE DEPOSITED ONTO THE SURFACE OF THE SUBSTRATE; AND

CONTINUOUSLY PROVIDING A SECOND SERIES OF ALIGNMENT IMAGES BY THE IMAGE CAPTURING SYSTEM DURING THE GENERATION OF THE SECOND MATERIAL DEPOSITION PROCESS FOR THE PURPOSES OF DETERMINING MISALIGNMENT OF THE SHADOW MASK WITH RESPECT TO THE SUBSTRATE

METHOD OF ACTIVE ALIGNMENT FOR DIRECT PATTERNING HIGH RESOLUTION MICRO-DISPLAY

RELATED APPLICATION INFORMATION

This application is based on U.S. Provisional Application No. 62/580,158 filed on Nov. 1, 2017.

FIELD OF INVENTION

The present invention relates to the fabrication of micro-displays, and more particular, a method of and system for active alignment for direct patterning a high-resolution micro-display via a shadow mask upon a micro-display substrate.

BACKGROUND

Resolution of micro-displays has increased rapidly as more advanced methods become available to pattern subpixels to the sizes less than 3.5 microns in the shortest dimension. Soon, subpixel dimensions of 2 microns or even less are anticipated. Organic light emitting diode (OLED) displays can be fabricated by several methods, including inkjet printing and vacuum deposition through shadow mask. The former method is widely used in fabrication of large format displays suitable for TV screens. The latter method is well suited for small format high resolution micro-displays. Recent success in direct patterning of OLED micro-displays with red, green and blue subpixels formed side-by-side can be credited to the development of the advanced high-resolution shadow mask with the openings on the scale of few microns. The implementation of such a high-resolution shadow mask faces several challenges. Among them is the alignment of the mask to the substrate containing backplane circuitry and pre-patterned active electrode, i.e., anode or cathode.

Alignment of a shadow mask against a substrate is typically achieved by aligning a special alignment mark, i.e., a fiducial, having a particular pattern pre-formed on a surface of the substrate against a fiducial of another particular pattern pre-formed on the shadow mask. There may be several fiducials in different locations on both the substrate and the mask for alignment observation purposes. The alignment occurs via optical inspection and analysis of the image formed by overlapping two fiducial patterns while the substrate and the mask are in contact. In such image analysis, a mathematical algorithm is used to verify if the two fiducial patterns are perfectly aligned as designed or if there are minute shifts between the two fiducials that need to be executed. Also, the deposition of organic material through the shadow mask is preferable in the configuration where both the substrate and the shadow mask are in full contact. This helps to avoid the deposited material reaching points beyond the area outlined by the shadow mask opening, i.e., to avoid a feathering effect, which is critical for the dimensional characteristics of the micro-display subpixels. Thus, during the organic material deposition, the substrate and the shadow mask must be in full contact for continuous alignment inspection and reduction of feathering.

During the organic material deposition, which is a thermal process, the kinetic energy of molecules arriving at the surface of the substrate may affect thermal conditions of the system and result in slight drift of the substrate against the shadow mask, i.e., the substrate-mask configuration can drift away from the perfect alignment, and the need for the re-alignment may arise as a result. The criteria for the alignment accuracy, or in other words the drift tolerance can be set prior to deposition. For example, for subpixel dimensions of 2-3 microns, the threshold, beyond which the alignment can be deemed inadequate, may be set to 100-200 nanometers or even less. While from the continuous alignment inspection and deposition process standpoint it is beneficial to have a full substrate-to-mask contact, the process of alignment itself will require movement of the shadow mask against the substrate, and such movement cannot be carried out while both are in full contact, and this presents a problem.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a method of active alignment of a shadow mask to a substrate, the method includes performing a first alignment process of the shadow mask and the substrate by moving at least one of the shadow mask and the substrate a first distance in a vertical direction with respect to each other, capturing a first alignment image, determining, in response to analyzing the first alignment image, at least one of a first correction distance in a control direction and a first rotational correction angle about a control axis, and aligning the shadow mask and the substrate by moving at least one of the first correction distance in the control direction and rotating the first rotational correction angle about the control axis.

The method further includes moving the shadow mask and the substrate in the vertical direction into a first contact position with each other based on performing the first alignment process of the shadow mask and substrate.

The method further includes performing a first material deposition process on the substrate by generating a material deposition flow configured to be deposited onto a surface of the substrate through shadow mask patterning through-holes, continuously capturing a first series of alignment images during the generation of the first material deposition flow onto the surface of the substrate, determining, during the generation of the first material deposition flow in response to analyzing the first series of alignment images, at least one of a second correction distance in a control direction and a second rotational correction angle about a control axis, and determining, during the generation of the first material deposition flow, whether the at least one of the second correction distance in the control direction and the second rotational correction angle about the control axis is greater than or equal to a predetermined value.

The method further includes performing, based on determining the at least one of the second correction distance and the second rotational correction angle being greater than or equal to the predetermined value, a second alignment process of the shadow mask and substrate by separating the shadow mask from the substrate by a second distance in the vertical direction, aligning the shadow mask and the substrate by at least one of the second correction distance in the control direction and the second rotational correction angle about the control axis, and moving the shadow mask and the substrate in the vertical direction into a second contact position with each other.

In another embodiment disclosed herein, a method of active alignment of a shadow mask to a substrate, the method includes providing an alignment system configured to move one of the shadow mask and the substrate with respect to each other based on optical image.

The method further includes performing a first alignment process of the shadow mask and the substrate by moving, by the alignment system, at least one of the shadow mask and the substrate a first distance in a vertical direction with respect to each other, capturing, by the alignment system, a first alignment image, determining, by the alignment system and in response to analyzing the first alignment image, at least one of a first correction distance in a control direction and a first rotational correction angle about a control axis, and aligning, by the alignment system, the shadow mask and the substrate by moving at least one of the first correction distance in the control direction and rotating the first rotational correction angle about the control axis.

The method further includes moving, by the alignment system, the shadow mask and the substrate in the vertical direction into a first contact position with each other based on performing the first alignment process of the shadow mask and substrate.

The method further includes performing a first material deposition process on the substrate by generating a material deposition flow configured to be deposited onto a surface of the substrate through shadow mask patterning through-holes, continuously capturing, by the alignment system, a first series of alignment images during the generation of the first material deposition flow onto the surface of the substrate, determining, by the alignment system during the generation of the first material deposition flow in response to analyzing the first series of alignment images, at least one of a second correction distance in a control direction and a second rotational correction angle about a control axis, and determining, by the alignment system during the generation of the first material deposition flow, whether the at least one of the second correction distance in the control direction and the second rotational correction angle about the control axis is greater than or equal to a predetermined value.

The method further includes performing, by the alignment system based on determining the at least one of the second correction distance and the second rotational correction angle being greater than or equal to the predetermined value, a second alignment process of the shadow mask and substrate by separating, by the alignment system, the shadow mask from the substrate by a second distance in the vertical direction, aligning, by the alignment system, the shadow mask and the substrate by at least one of the second correction distance in the control direction and the second rotational correction angle about the control axis, and moving, by the alignment system, the shadow mask and the substrate in the vertical direction into a second contact position with each other.

In a further embodiment disclosed herein, a method of active alignment of a shadow mask to a substrate, the method including providing an alignment system including a motion control processor configured to move at least one of the shadow mask and the substrate with respect to each other, an image capturing system configured to capture an alignment image representing an alignment condition of the shadow mask with respect to the substrate, and a processor configured to perform alignment determination and motion control in communication with the motion control processor and the image capturing system.

The method further includes performing a first alignment process of the shadow mask and the substrate by moving, by the motion control processor, at least one of the shadow mask and the substrate a first distance in a vertical direction with respect to each other, capturing, by the image capturing system, a first alignment image, determining, by the alignment system and in response to analyzing the first alignment image, at least one of a first correction distance in a control direction of the motion control processor and a first rotational correction angle about a control axis of the motion control processor, and aligning, by the motion control processor, the shadow mask and the substrate by moving at least one of the first correction distance in the control direction and rotating the first rotational correction angle about the control axis.

The method further includes moving, by the motion control processor, the shadow mask and the substrate in the vertical direction into a first contact position with each other based on performing the first alignment process of the shadow mask and substrate.

The method further includes performing a first material deposition process on the substrate by generating a material deposition flow configured to be deposited onto a surface of the substrate through shadow mask patterning through-holes, continuously capturing, by the image capturing system, a first series of alignment images during the generation of the first material deposition flow onto the surface of the substrate, determining, by the alignment system during the generation of the first material deposition flow in response to analyzing the first series of alignment images, at least one of a second correction distance in a control direction of the motion control processor and a second rotational correction angle about a control axis of the motion control processor, determining, by the alignment system during the generation of the first material deposition flow, whether the at least one of the second correction distance in the control direction of the motion control processor and the second rotational correction angle about the control axis is greater than or equal to a predetermined value.

The method further includes performing, by the alignment system based on determining the at least one of the second correction distance and the second rotational correction angle being greater than or equal to the predetermined value, a second alignment process of the shadow mask and substrate by blocking the material deposition flow through the shadow mask patterning through-holes, separating, by the motion control processor, the shadow mask from the substrate by a second distance in the vertical direction, aligning, by the motion control processor, the shadow mask and the substrate by at least one of the second correction distance in the control direction of the motion control processor and the second rotational correction angle about the control axis of the motion control processor, and moving, by the motion control processor, the shadow mask and the substrate in the vertical direction into a second contact position with each other; and performing a second material deposition process on the substrate.

BRIEF DESCRIPTION OF THE SEVERAL VIEWS OF THE DRAWINGS

The embodiments of the invention will be better understood from the following detailed description with reference to the drawings, which are not necessarily drawing to scale and in which:

FIG. 3A illustrates first step in a method of utilizing an active alignment system to align a shadow mask to a substrate, the first step including a first alignment process;

FIG. 3B illustrates second step in a method of utilizing an active alignment system to align a shadow mask to a substrate, the second step including a deposition and imaging process;

FIG. 3C illustrates third step in a method of utilizing an active alignment system to align a shadow mask to a substrate, the third step including a second alignment process;

FIG. 3D illustrates fourth step in a method of utilizing an active alignment system to align a shadow mask to a substrate, the fourth step including a second deposition and imaging process; and FIG. 4A-4C illustrates logic flow diagram of a method of utilizing an active alignment system to align a shadow mask to a substrate as shown in FIGS. 3A to 3D.

DETAILED DESCRIPTION

Figure 1:
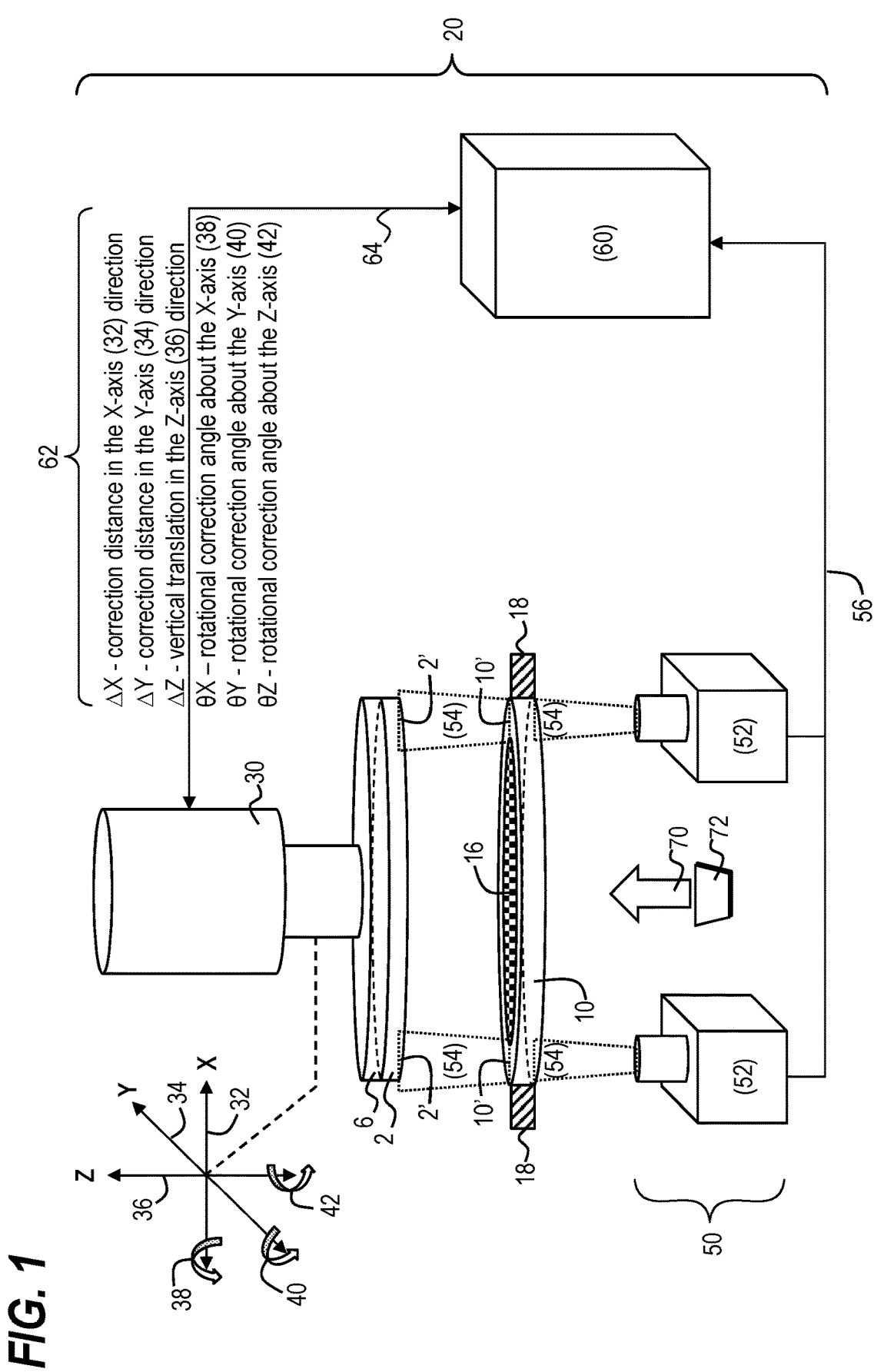
FIG. 1 illustrates an active alignment system and setup of a substrate with respect to a shadow mask.

The present invention provides a solution to the problem of shadow mask and substrate alignment during deposition process. In summary, the deposition process may be interrupted, the separate shadow mask and substrate may be pulled apart to such distance that can allow relative movement and then realignment of the mask and substrate, and then bring the shadow mask and substrate back to full contact to thereby continue the deposition process. FIG. 1 illustrates an active alignment system 20 with a general setup of a substrate 2 with respect to a shadow mask 10. One of the two options can be implemented to accomplish this solution: either the mask 10 can be stationary while the substrate 2 moves, or the substrate 2 may be stationary while the mask 10 moves. Thus, in the following description, the substrate 2 may be substituted for the shadow mask 10, and visa-versa, for the purposes of moving each respective element with respect to the other.

FIG. 1 illustrates the substrate 2, that may include a silicon wafer, being attached to substrate holder 6 that is controlled by a motion mechanism system 20 which may provide lateral motion along a planar X-axis 32 and a planar Y-axis 34 in both positive and negative directions, as well as a vertical motion along a vertical Z-axis 36. Additionally, a motion controller 30, or robot may have a motion controller 30 rotational X-axis 38 about the X-axis 32, a motion controller 30 rotational Y-axis 40 about the Y-axis 34, and motion controller 30 rotational Z-axis 42 about the vertical Z-axis 36 may be provided by the motion controller 30 to achieve alignment in six degrees of freedom between the substrate 2 and the shadow mask 10.

In FIG. 1, the shadow mask 10 may be stationary while supported by a shadow mask holder 18 with respect to the substrate 2 and substrate holder 6 connected to the motion controller 30 and thereby subject to the controlled movement of the motion controller 30.

The shadow mask 10 typically includes shadow mask patterning through-holes 16 in a generally central portion of the shadow mask 10 for the purposes of patterning a material deposition flow 70 there-through onto the substrate 2. The shadow mask 10 is typically supported by a shadow mask holder 18 in a fixed position. Again, in the alternative, the shadow mask 10 and shadow mask holder 18 may not be in a fixed position but be connected to the motion controller 30 and the substrate 2 and substrate holder 6 may be in fixed position.

Figure 2A:
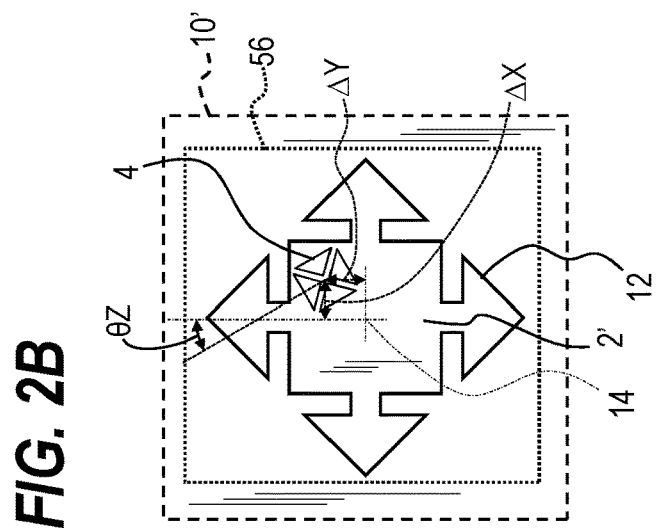
FIG. 2A illustrates corresponding alignment marks on a peripheral substrate portion and a peripheral shadow mask portion and the result of a successful alignment between the two alignment marks.
Figure 2B:
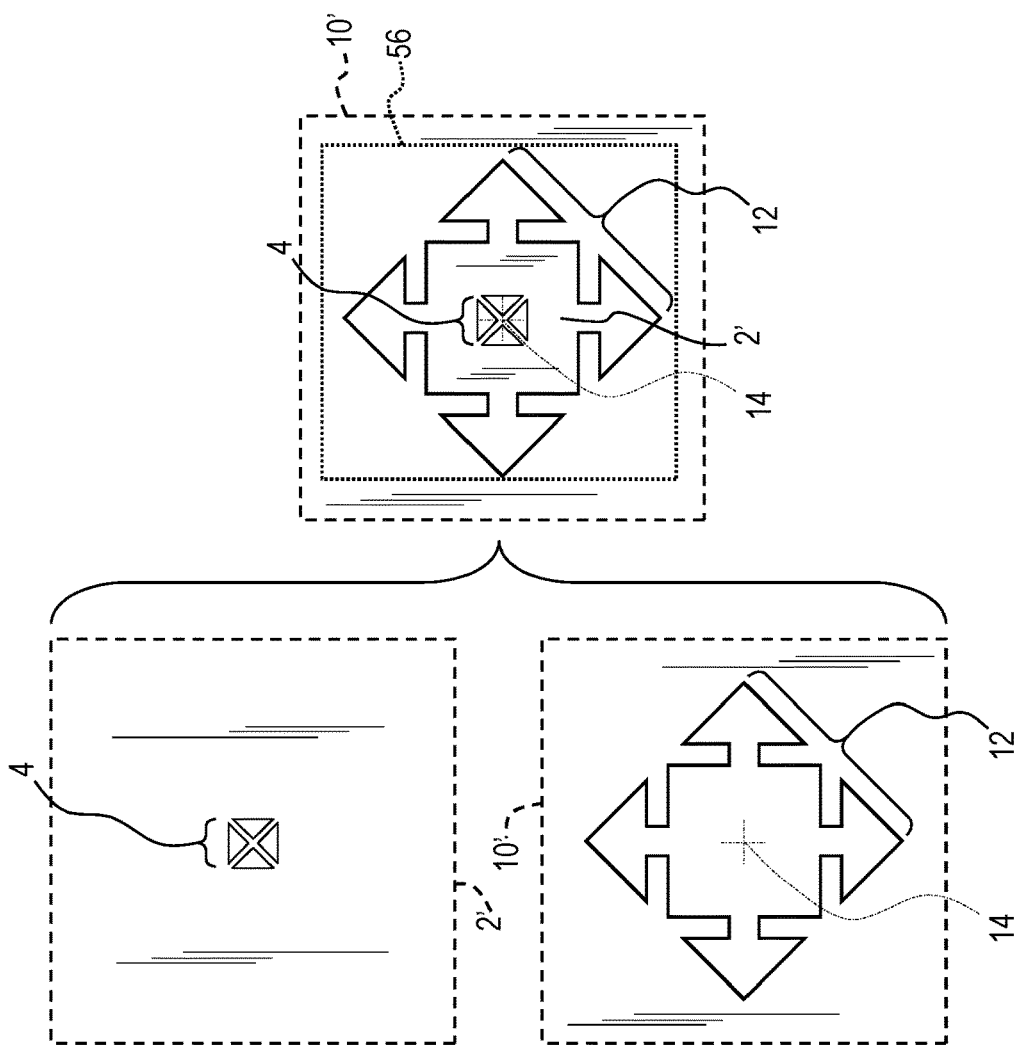
FIG. 2B illustrates the corresponding alignment marks on a peripheral substrate portion and a peripheral shadow mask portion resulting in a non-successful alignment between the two alignment marks.

FIG. 1 further illustrates an image capturing system 50 that may include one or a plurality of imaging devices 52 for capturing an alignment image 56 via an imaging device field of view 54 discussed in further detail in FIGS. 2A and 2B. Each alignment image 56 capturing an imaging device field of view 54 is directed to peripheral shadow mask portion 10' of the shadow mask 10 and peripheral substrate portion 2' of the substrate 2, where these peripheral portions are outside of both the shadow mask patterning through-holes 16 and a corresponding target material deposition area on the substrate 2. Each peripheral substrate portion 2' and corresponding peripheral shadow mask portion 10' may a receive substrate alignment mark 4 and a corresponding shadow mask alignment mark 12 for sight alignment within the imaging device field of view 54 of the imaging device 52 as later described in FIGS. 2A and 2B.

The alignment image 56 from the image capturing system 50 may the transmitted to an alignment determination and motion control processor 60 for processing the alignment image 56, determining a particular state of alignment from the alignment image 56 and generating one or a series of motion control signals 62 configured to move the motion controller 30 to thereby align the substrate 2 and the shadow mask 10 based on the particularly determined state of alignment. The motion control signals 62 may correspond to each of the axes of linear motion and rotation motion of the motion controller 30, namely, ΔX a correction distance in the X-axis direction 32, ΔY a correction distance in the Y-axis direction 34, ΔZ a vertical translation in the Z-axis direction 36, θX a rotational correction angle about the X-axis 38, θY a rotational correction angle about the Y-axis 40, and θZ a rotational correction angle about the Z-axis 42.

FIG. 2A illustrates corresponding alignment marks on the peripheral substrate portion 2' and the peripheral shadow mask portion 10' of the substrate 2 and the shadow mask 10, respectively, as illustrated in FIG. 1 and a result of a successful alignment between the two alignment marks. The peripheral substrate portion 2' and peripheral shadow mask portion 10' may be disposed outside of an area defined by the shadow mask patterning through-holes 16 and a target material deposition area on the substrate 2.

In particular, FIG. 2A illustrates the peripheral substrate portion 2' that includes a substrate alignment mark 4, (or fiducial), observable from one surface of the substrate 2. FIG. 2A further illustrates the peripheral shadow mask portion 10' that includes a shadow mask alignment mark 12, (or fiducial), that constitutes an opening through the peripheral shadow mask portion 10' that the substrate alignment mark 4 may be observed by the image capturing system 50 when the peripheral substrate portion 2' and peripheral shadow mask portion 10' are in a separated position from each other, as FIG. 1 depicts, or when the peripheral substrate portion 2' and peripheral shadow mask portion 10' are in physical contact with each other, for example, when a material deposition flow 70 process is either imminent or in process. The imaging device field of view 54 illustrated in FIG. 1 is able to capture an alignment image 56 including the substrate alignment mark 4 on the peripheral substrate portion 2' through the shadow mask alignment mark 12 of the peripheral shadow mask portion 10'.

The alignment image 56, generally depicted in the right-hand image of FIG. 2A, is sent to the alignment determination and motion control processor 60 to determine the alignment state of the substrate 2 with respect to the shadow mask 10. The alignment system and motion control processor 60 may determine or generate a shadow mask alignment mark center 14 of the shadow mask 10 based on the geometry of the shadow mask alignment mark 12 and compare it with the location of the substrate alignment mark 4 in the alignment image 56. FIG. 2A illustrates the substrate alignment mark 4 being perfectly aligned with the shadow mask alignment mark 12 where the shadow mask alignment mark center 14 is centered on and oriented squarely with the substrate alignment mark 4.

FIG. 2B illustrates the corresponding alignment marks of peripheral substrate portion 2' and the peripheral shadow mask portion 10' resulting in a non-successful alignment between the two alignment marks. FIG. 2B further illustrates the substrate alignment mark 4 not being aligned with the shadow mask alignment mark 12 where the shadow mask alignment mark center 14 is not aligned with and in proper orientation to the substrate alignment mark 4. In this situation, the alignment determination and motion control processor 60 may calculate any one of the series of motion control signals 62 to be sent to the motion controller 30 to properly align the substrate 2 with the shadow mask 10. For example, the alignment determination and motion control processor 60 may calculate a ΔX as a correction distance in the X-axis direction from the shadow mask alignment mark center 14, a ΔY as a correction distance in the Y-axis direction from the shadow mask alignment mark center 14, and a θZ as a rotational correction angle about the Z-axis, wherein each of these motion control signals 62 may be sent the motion controller 30. Furthermore, FIG. 1 illustrates motion position signals 64 may be sent from the motion controller 30 after receipt of the motion control signals 62 for feedback confirmation of the positioning taken by the motion controller 30 to align the substrate 2 and shadow mask 10 during each individual alignment process.

FIG. 3A-3D illustrate at least four steps of a method of utilizing the active alignment system 20 illustrated in FIGS. 1 and 2A-2B that align a shadow mask 10 with respect to a substrate 2.

FIG. 3A illustrates first step of a method of utilizing an active alignment system 20 to align a shadow mask 10 to a substrate 2 including a first alignment process. In FIG. 3A, the initial alignment of the shadow mask 10 with respect to the substrate 2 is performed, while mask 10 and substrate 2 are spaced apart from each other via vertical translation in the Z-axis direction by the motion controller 30 with the gap D between them set to about 3-100 microns. The gap D may be controlled by the motion controller 30 based on feedback from an optical gap sensor (not illustrated) configured to measure the distance between the shadow mask 10 and the substrate 2. The optical gap sensor reflects monochromatic light off the shadow mask and wafer and detects the reflected light of both surfaces to measure the difference as a distance. One or more optical gap sensors may be disposed around the peripheral substrate portion 2' of the substrate 2 and the peripheral shadow mask portion 10' of the shadow mask 10.

The motion controller 30 may move the substrate 2 (or in an alternative embodiment, the shadow mask 10) with respect to each other along the planar X-axis 32 and the planar Y-axis 34 to attain a first perfect alignment condition as confirmed by the alignment image 56 processed by alignment determination and motion control processor 60. For example, motion controller 30 may move ΔX in a correction distance in the X-axis direction and/or ΔY in a correction distance in the Y-axis direction.

The gap D value may depend on the focusing capability of the image capturing system 50 to deliver a well resolved alignment image 56 of both the shadow mask alignment mark 12 and the substrate alignment mark 4 through the imaging device field of view 54 for analysis by the alignment determination and motion control processor 60 using mathematical algorithms and optical image recognition techniques. In the example shown in FIG. 3A, shadow mask 10 and shadow mask 10 holder 18 may be stationary, while substrate 2 and substrate holder 6 may move dependent upon the attached motion controller 30. In an alternative embodiment, the substrate 2 may be stationary, and the shadow mask 10 may move dependent upon a corresponding attached motion controller 30.

FIG. 3B illustrates second step in a method of utilizing an active alignment system 20 to align a shadow mask 10 to a substrate 2, the second step including a material deposition flow 70 process and image capturing process. FIG. 3B illustrates the motion controller 30 bringing the mask 10 and the substrate 2 to full contact with each other to begin a continuous alignment inspection process through at least one stage of material deposition flow 70 from a material deposition source 72 through the shadow mask 10 patterning through-holes 16 onto the substrate 2. The material deposition source 72 may include a stationary or a moving evaporative source which may a point source (crucible), a linear source or any other type of source (planar or showerhead source) configured to deliver deposition material onto the substrate 2 through the shadow mask 10.

In an alternative embodiment, the active alignment system 20 may have a user-selectable option to choose between a continuous alignment inspection process, or a periodic alignment inspection process where the periodic increments may be chosen manually by a user or automatically by the alignment determination and motion control processor 60.

The stationary or moving material deposition source 72 will not interfere with the continuous inspection of the shadow mask and substrate alignment marks by the image capturing system 50 as the imaging device 52 is located away from the material deposition flow or plume 70 and may be shielded (not shown) from the material deposition flow during the deposition process.

The deposition process is continued with continuous alignment inspection through an imaging device field of view 54 via at least one imaging device 52 of the image capturing system 50 and may continue until the active alignment system 20 determines a minute drift from the first alignment condition of FIG. 3A. A first continuous minute alignment process may shift either the substrate 2 or the shadow mask 10 via the motion controller 30 during the material deposition flow 70 process. Continuous minute, i.e., less than 200 nm, shifts in at least the motion controller planar X-axis 32 and the motion controller planar Y-axis 34, or in any other motion controller 30 translational or rotational axis as determined by the alignment determination and motion control processor 60 may occur during the deposition process as long as the translational or rotational direction value is determined to be less than a preset or predetermined value. This continuous minute alignment process may be enabled or disabled manually by an operator or automatically by the alignment determination and motion control processor 60 the during the material deposition process.

The deposition process may further continue with continuous alignment inspection until the active alignment system 20 determines a drift from the first alignment condition of FIG. 3A being greater than a predetermined value. The assessment of the drift is based on an alignment accuracy threshold set prior to the process of the material deposition flow 70. When this threshold is reached, the deposition process is interrupted and the substrate 2 and shadow mask 10 are separated by the motion controller 30 for a realignment process detailed in FIG. 3C.

FIG. 3C illustrates third step in a method of utilizing an active alignment system 20 to align a shadow mask 10 to a substrate 2, the third step including a second alignment process. FIG. 3C illustrates the continuous alignment inspection and the deposition process being interrupted by placing a material deposition flow barrier 74 in the path of the material deposition flow 70 to block the evaporation plume or by moving the material deposition source 72, described above, away from the substrate 2 and shadow mask 10.

FIG. 3C further illustrates the shadow mask 10 and substrate 2, (including the substrate deposition material 8 deposited during the FIG. 3B process of material deposition flow 70), being spaced apart from each other via vertical translation in the Z-axis direction by the motion controller 30 with the gap D between them set to about 3-100 microns. A second alignment of the shadow mask 10 with respect to the substrate 2 is performed where the motion controller 30 either moves the substrate 2 (or in an alternative embodiment, the shadow mask 10) with respect to each other along the planar X-axis 32 and the planar Y-axis 34 to attain a second perfect alignment condition as confirmed by a second alignment image 56 processed by alignment determination and motion control processor 60. For example, motion controller 30 may move ΔX' in a correction distance in the X-axis direction and/or ΔY' in a correction distance in the Y-axis direction.

FIG. 3D illustrates fourth step in a method of utilizing an active alignment system 20 to align a shadow mask 10 to a substrate 2, the fourth step including a second material deposition process and image capturing process. FIG. 3D illustrates the shadow mask 10 6 and the substrate 2 are brought back to full contact via the motion controller 30 by ΔZ' vertical translation in the Z-axis direction and the continuous alignment inspection via the image capturing system 50 and deposition process is restarted. FIG. 3D illustrates re-initiation of the continuous alignment inspection and the material deposition flow barrier 74 being removed from the path of the material deposition flow 70 to un-block the evaporation plume or by moving evaporation source, for example, the material deposition source 72, back into position for material deposition to the substrate 2 via the shadow mask 10. This process material deposition process may then begin a second continuous minute alignment as described above in FIG. 3B, and when a drift from the second alignment condition of FIG. 3C is greater than the same or another predetermined value, the process again will be interrupted for a realignment where the substrate 2 and shadow mask 10 are separated.

Last three steps of FIG. 3B-3D may be repeated in a cyclical manner during the entire material deposition process, and where the number of such cycles are dictated by a corresponding number of drift occurrences from the perfect alignment condition determined by the alignment determination and motion control processor 60.

Figure 4B:
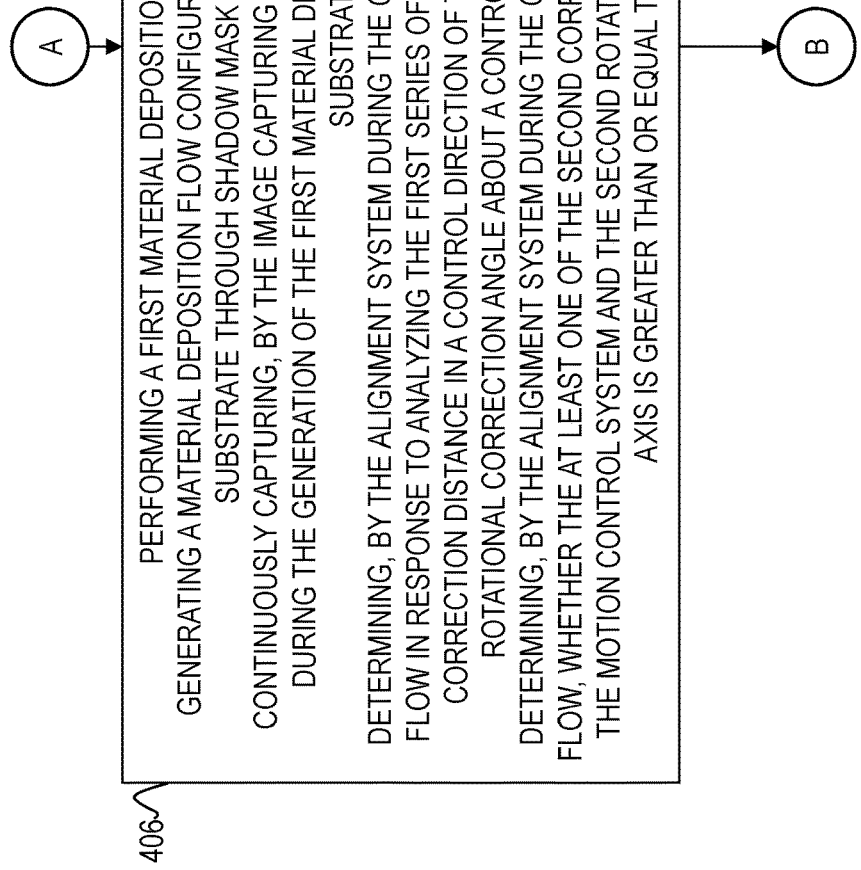

FIG. 4A-4C illustrates logic flow diagram of a method of utilizing an active alignment system 20 to align a shadow mask 10 to a substrate 2 as shown in FIG. 3A to 3D.

The method of active alignment of a shadow mask 10 to a substrate 2 includes providing 400 an alignment system 20 having a motion controller 30 configured to move at least one of the shadow mask 10 and the substrate 2 with respect to each other, an image capturing system 50 configured to capture an alignment image 56 representing an alignment condition of the shadow mask 10 with respect to the substrate 2, and a processor 60 configured to perform alignment determination and motion control in communication with the motion controller 30 and the image capturing system 50.

The method of active alignment of the shadow mask 10 to the substrate 2 further includes performing 402 a first alignment process of the shadow mask 10 and the substrate 2 by moving, by the motion controller 30, at least one of the shadow mask 10 and the substrate 2 a first distance in a vertical direction with respect to each other, capturing, by the image capturing system 50, a first alignment image 56, determining, by the active alignment system 20 and in response to analyzing the first alignment image 56, at least one of a first correction distance in a control direction of the motion controller 30 and a first rotational correction angle about a control axis of the motion controller 30, and aligning, by the motion controller 30, the shadow mask 10 and the substrate 2 by moving at least one of the first correction distance in the control direction and rotating the first rotational correction angle about the control axis.

The method of active alignment of the shadow mask 10 to the substrate 2 further includes moving 404, by the motion controller 30, the shadow mask 10 and the substrate 2 in the vertical direction into a first contact position with each other based on performing the first alignment process of the shadow mask 10 and substrate 2.

FIG. 4B further illustrates the method of active alignment of the shadow mask 10 to the substrate 2 further includes performing 406 a first material deposition process on the substrate 2 by generating a material deposition flow 70 configured to be deposited onto a surface of the substrate 2 through shadow mask 10 patterning through-holes 16, continuously capturing, by the image capturing system 50, a first series of alignment image 56 during the generation of the first material deposition flow 70 onto the surface of the substrate 2, determining, by the alignment system 20 during the generation of the first material deposition flow 70 in response to analyzing the first series of alignment image 56, at least one of a second correction distance in a control direction of the motion controller 30 and a second rotational correction angle about a control axis of the motion controller 30, and determining, by the active alignment system 20 during the generation of the first material deposition flow 70, whether the at least one of the second correction distance in the control direction of the motion controller 30 and the second rotational correction angle about the control axis is greater than or equal to a predetermined value. The predetermined value may be set manually by an operator of the active alignment system 20 or may be set and/or dynamically adjusted by the alignment determination and motion control processor 60 during the method of active alignment.

FIG. 4C further illustrates the method of active alignment of the shadow mask 10 to the substrate 2 further includes performing 408, by the active alignment system 20 based on determining the at least one of the second correction distance and the second rotational correction angle being greater than or equal to the predetermined value, a second alignment process of the shadow mask 10 and substrate 2 by blocking the material deposition flow 70 through the shadow mask 10 patterning through-holes 16, separating, by the motion controller 30, the shadow mask 10 from the substrate 2 by a second distance in the vertical direction, aligning, by the motion controller 30, the shadow mask 10 and the substrate 2 by at least one of the second correction distance in the control direction of the motion controller 30 and the second rotational correction angle about the control axis of the motion controller 30, and moving, by the motion controller 30, the shadow mask 10 and the substrate 2 in the vertical direction into a second contact position with each other.

The method of active alignment of the shadow mask 10 to the substrate 2 further includes performing 410 a second material deposition process on the substrate 2 including unblocking the material deposition flow 70 through the shadow mask 10 patterning through-holes 16 configured to enable the material deposition flow 70 to be deposited onto the surface of the substrate 2, and continuously providing a second series of alignment images 56 by the image capturing system 50 during the generation of the second material deposition process for the purposes of determining misalignment of the shadow mask 10 with respect to the substrate 2.

The method of active alignment may further include where providing the alignment system 20 further includes providing an active alignment system 20 including an image alignment and motion control processor 60 and a motion controller 30 configured to move at least one of the shadow mask 10 with respect to the substrate 2, or the substrate 2 with respect to the shadow mask 10.

The method of active alignment may further include where providing the alignment system further includes providing an image capturing system 50 configured to capture an alignment image 56 representing an alignment condition of the shadow mask 10 with respect to the substrate 2.

The method of active alignment may further include where the first distance D in the vertical direction comprises a spacing distance between 3-100 microns. The method of active alignment may further include wherein the second distance in the vertical direction comprises a spacing distance between 3-100 microns.

The method of active alignment may further include where the first alignment image 56 comprises one of a shadow mask alignment mark 12 on the shadow mask 10, or a substrate alignment mark 4 on the substrate 2.

The method of active alignment may further include where the first alignment image 56 comprises one of a digital photograph image or a video image.

The method of active alignment may further include where the first series of alignment images 56 comprises one of a series of digital photographs or a video image, and each first series of alignment images 56 further comprise the shadow mask alignment mark 12 on the shadow mask 10 and the substrate alignment mark 4 on the substrate 2.

The method of active alignment may further include where the first correction distance in the control direction comprises at least one of a first planar direction correction distance, a second planar direction correction distance perpendicular to the first planar direction, and a vertical direction correction distance perpendicular to the first and second planar directions.

The method of active alignment may further include where the first rotational correction angle about the control axis comprises at least one of a first planar direction axis rotational correction angle, a second planar direction axis rotational correction angle, and a vertical direction axis rotational correction angle.

The method of active alignment may further include where the performing the second alignment process of the shadow mask 10 and substrate 2 further comprises blocking the material deposition flow 70 through the shadow mask 10 patterning through-holes 16.

The method of active alignment may further include performing a second material deposition process on the substrate 2 by unblocking the material deposition flow 70 through the shadow mask 10 patterning through-holes 16 configured to enable the material deposition flow 70 to be deposited onto the surface of the substrate 2.

The method of active alignment may further include wherein the second material deposition process on the substrate 2 further comprises continuously providing a second series of alignment images 56 by the image capturing system 50 during the generation of the second material deposition process for the purposes of determining misalignment of the shadow mask 10 with respect to the substrate 2.

The method of active alignment may further include wherein the second material deposition process on the substrate 2 further comprises unblocking the material deposition flow 70 through the shadow mask 10 patterning through-holes 16 configured to enable the material deposition flow 70 to be deposited onto the surface of the substrate 2.

The method of active alignment may further include wherein the second material deposition process on the substrate 2 further comprises continuously providing a second series of alignment images by the image capturing system 50 during the generation of the second material deposition process for the purposes of determining misalignment of the shadow mask 10 with respect to the substrate 2.

It is to be understood that the disclosure teaches just one example of the illustrative embodiment and that many variations of the invention can easily be devised by those skilled in the art after reading this disclosure.

What is claimed is:

1. A method of active alignment of a shadow mask to a substrate, the method comprising:
   performing a first alignment process of the shadow mask and the substrate by moving at least one of the shadow mask and the substrate a first
   distance in a vertical direction with respect to each other, capturing a first alignment image,
      determining, in response to analyzing the first alignment image, at least one of a first correction distance in a control direction and a first rotational correction angle about a control axis, and
      aligning the shadow mask and the substrate by moving at least one of the first correction distance in the control direction and rotating the first rotational correction angle about the control axis;
   moving the shadow mask and the substrate in the vertical direction into a first contact position with each other based on performing the first alignment process of the shadow mask and substrate;
   performing a first material deposition process on the substrate by
      generating a material deposition flow configured to be deposited onto a surface of the substrate through shadow mask patterning through-holes,
      continuously capturing a first series of alignment images during the generation of the first material deposition flow onto the surface of the substrate,
      determining, during the generation of the first material deposition flow in response to analyzing the first series of alignment images, at least one of a second correction distance in a control direction and a second rotational correction angle about a control axis, and
      determining, during the generation of the first material deposition flow, whether the at least one of the second correction distance in the control direction and the second rotational correction angle about the control axis is greater than or equal to a predetermined value; and performing, based on determining the at least one of the second correction distance and the second rotational correction angle being greater than or equal to the predetermined value, a second alignment process of the shadow mask and substrate by separating the shadow mask from the substrate by a second distance in the vertical direction, aligning the shadow mask and the substrate by at least one of the second correction distance in the control direction and the second rotational correction angle about the control axis, and moving the shadow mask and the substrate in the vertical direction into a second contact position with each other.

2. The method according to claim 1, wherein the first distance in the vertical direction comprises a spacing distance between 3-100 microns.

3. The method according to claim 1, wherein the first alignment image comprises one of a digital photograph image or a video image.

4. The method according to claim 1, wherein the first alignment image comprises a shadow mask alignment mark on the shadow mask and a substrate alignment mark on the substrate.

5. The method according to claim 1, wherein the first correction distance in the control direction comprises at least one of
   a first planar direction correction distance,
   a second planar direction correction distance perpendicular to the first planar direction, and
   a vertical direction correction distance perpendicular to the first and second planar directions.

6. The method according to claim 5, wherein the first rotational correction angle about the control axis comprises at least one of
   a first planar direction axis rotational correction angle,
   a second planar direction axis rotational correction angle, and
   a vertical direction axis rotational correction angle.

7. The method according to claim 1, wherein the first series of alignment images comprises one of a series of digital photographs or a video image, and each first series of alignment images further comprise the shadow mask alignment mark on the shadow mask and the substrate alignment mark on the substrate.

8. A method of active alignment of a shadow mask to a substrate, the method comprising:
   providing an alignment system configured to move one of the shadow mask and the substrate with respect to each other based on optical image;
   performing a first alignment process of the shadow mask and the substrate by
      moving, by the alignment system, at least one of the shadow mask and the substrate a first distance in a vertical direction with respect to each other,
      capturing, by the alignment system, a first alignment image,
      determining, by the alignment system and in response to analyzing the first alignment image, at least one of a first correction distance in a control direction and a first rotational correction angle about a control axis, and
      aligning, by the alignment system, the shadow mask and the substrate by moving at least one of the first correction distance in the control direction and rotating the first rotational correction angle about the control axis;
   moving, by the alignment system, the shadow mask and the substrate in the vertical direction into a first contact position with each other based on performing the first alignment process of the shadow mask and substrate;
   performing a first material deposition process on the substrate by
      generating a material deposition flow configured to be deposited onto a surface of the substrate through shadow mask patterning through-holes,
      continuously capturing, by the alignment system, a first series of alignment images during the generation of the first material deposition flow onto the surface of the substrate,
      determining, by the alignment system during the generation of the first material deposition flow in response to analyzing the first series of alignment images, at least one of a second correction distance in a control direction and a second rotational correction angle about a control axis, and
      determining, by the alignment system during the generation of the first material deposition flow, whether the at least one of the second correction distance in the control direction and the second rotational correction angle about the control axis is greater than or equal to a predetermined value; and
   performing, by the alignment system based on determining the at least one of the second correction distance and the second rotational correction angle being greater than or equal to the predetermined value, a second alignment process of the shadow mask and substrate by
      separating, by the alignment system, the shadow mask from the substrate by a second distance in the vertical direction,
      aligning, by the alignment system, the shadow mask and the substrate by at least one of the second correction distance in the control direction and the second rotational correction angle about the control axis, and
      moving, by the alignment system, the shadow mask and the substrate in the vertical direction into a second contact position with each other.

9. The method according to claim 8, wherein the performing the second alignment process of the shadow mask and substrate further comprises at least one of blocking the material deposition flow through the shadow mask patterning through-holes and moving the material deposition flow away from the shadow mask patterning through-holes.

10. The method according to claim 9, the method further comprising performing a second material deposition process on the substrate by at least one of unblocking the material deposition flow through the shadow mask patterning through-holes and moving the material deposition flow configured to enable the material deposition flow to be deposited onto the surface of the substrate.

11. The method according to claim 10, wherein the second material deposition process on the substrate further comprises continuously providing a second series of alignment images by the image capturing system during the generation of the second material deposition process for the purposes of determining misalignment of the shadow mask with respect to the substrate.

12. The method according to claim 8, wherein providing the alignment system further includes providing a motion control processor configured to move at least one of the shadow mask with respect to the substrate, and the substrate with respect to the shadow mask.

13. The method according to claim 8, wherein providing the alignment system further includes providing an image capturing system configured to capture an alignment image representing an alignment condition of the shadow mask with respect to the substrate.

14. The method according to claim 13, wherein the alignment image comprises a shadow mask alignment mark on the shadow mask and a substrate alignment mark on the substrate.

15. A method of active alignment of a shadow mask to a substrate, the method comprising:
  providing an alignment system including
    a motion control processor configured to move at least one of the shadow mask and the substrate with respect to each other,
    an image capturing system configured to capture an alignment image representing an alignment condition of the shadow mask with respect to the substrate, and
    a processor configured to perform alignment determination and motion control in communication with the motion control processor and the image capturing system;
  performing a first alignment process of the shadow mask and the substrate by moving, by the motion control processor, at least one of the shadow mask and the substrate a first distance in a vertical direction with respect to each other,
  capturing, by the image capturing system, a first alignment image,
  determining, by the alignment system and in response to analyzing the first alignment image, at least one of a first correction distance in a control direction of the motion control processor and a first rotational correction angle about a control axis of the motion control processor, and
  aligning, by the motion control processor, the shadow mask and the substrate by moving at least one of the first correction distance in the control direction and rotating the first rotational correction angle about the control axis;
  moving, by the motion control processor, the shadow mask and the substrate in the vertical direction into a first contact position with each other based on performing the first alignment process of the shadow mask and substrate;
  performing a first material deposition process on the substrate by
    generating a material deposition flow configured to be deposited onto a surface of the substrate through shadow mask patterning through-holes,
    continuously capturing, by the image capturing system, a first series of alignment images during the generation of the first material deposition flow onto the surface of the substrate,
    determining, by the alignment system during the generation of the first material deposition flow in response to analyzing the first series of alignment images, at least one of a second correction distance in a control direction of the motion control processor and a second rotational correction angle about a control axis of the motion control processor,
    determining, by the alignment system during the generation of the first material deposition flow, whether the at least one of the second correction distance in the control direction of the motion control processor and the second rotational correction angle about the control axis is greater than or equal to a predetermined value;
  performing, by the alignment system based on determining the at least one of the second correction distance and the second rotational correction angle being greater than or equal to the predetermined value, a second alignment process of the shadow mask and substrate by
    blocking the material deposition flow through the shadow mask patterning through-holes,
    separating, by the motion control processor, the shadow mask from the substrate by a second distance in the vertical direction,
    aligning, by the motion control processor, the shadow mask and the substrate by at least one of the second correction distance in the control direction of the motion control processor and the second rotational correction angle about the control axis of the motion control processor, and
    moving, by the motion control processor, the shadow mask and the substrate in the vertical direction into a second contact position with each other; and
  performing a second material deposition process on the substrate.

16. The method according to claim 15, wherein the motion control processor is further configured to move at least one of the shadow mask and the substrate with respect to each other in at least one of a first and a second planar direction, a vertical direction perpendicular to the first and second planar directions, about a first and second rotational axis corresponding to the first and the second planar direction, respectively, and about a third rotational axis corresponding to the vertical direction.

17. The method according to claim 15, wherein the second correction distance in the control direction comprises at least one of
  a first planar direction correction distance,
  a second planar direction correction distance perpendicular to the first planar direction,
  a vertical direction correction distance perpendicular to the first and second planar directions, and
  wherein the second rotational correction angle about the control axis comprises at least one of
  a first planar direction axis rotational correction angle,
  a second planar direction axis rotational correction angle, and
  a vertical direction axis rotational correction angle.

18. The method according to claim 15, wherein the second distance in the vertical direction comprises a spacing distance between 3-100 microns.

19. The method according to claim 15, wherein the second material deposition process on the substrate further comprises at least one of unblocking the material deposition flow through the shadow mask patterning through-holes and moving the material deposition flow configured to enable the material deposition flow to be deposited onto the surface of the substrate.

20. The method according to claim 15, wherein the second material deposition process on the substrate further comprises continuously providing a second series of alignment images by the image capturing system during the generation of the second material deposition process for the purposes of determining misalignment of the shadow mask with respect to the substrate.

21. The method according to claim 15, further including providing the predetermined value at least one of manually by an operator and dynamically set by the processor during any material deposition process.

22. The method according to claim 15, further including providing a continuous minute alignment process controlled by the alignment system during the generation of the material deposition flow, where the continuous minute alignment process moves one of the substrate and the shadow mask in an increment less than 200 nm in at least one of a planar and rotational direction.

* * * * *